United States Patent
Richter et al.

(10) Patent No.: US 11,561,603 B2
(45) Date of Patent: Jan. 24, 2023

(54) MEMORY DEVICE LOW POWER MODE

(71) Applicant: Micron Technology, Inc., Boise, ID (US)

(72) Inventors: Michael Dieter Richter, Ottobrunn (DE); Thomas Hein, Munich (DE); Wolfgang Anton Spirkl, Germering (DE); Martin Brox, Munich (DE); Peter Mayer, Neubiberg (DE)

(73) Assignee: Micron Technology, Inc., Boise, ID (US)

( * ) Notice: Subject to any disclaimer, the term of this patent is extended or adjusted under 35 U.S.C. 154(b) by 290 days.

(21) Appl. No.: 16/719,904

(22) Filed: Dec. 18, 2019

(65) Prior Publication Data

US 2020/0201418 A1    Jun. 25, 2020

Related U.S. Application Data

(60) Provisional application No. 62/782,661, filed on Dec. 20, 2018.

(51) Int. Cl.
*G06F 1/3234* (2019.01)
*G11C 5/14* (2006.01)
*G06F 1/3225* (2019.01)

(52) U.S. Cl.
CPC .......... *G06F 1/3275* (2013.01); *G06F 1/3225* (2013.01); *G11C 5/14* (2013.01)

(58) Field of Classification Search
CPC ........ G06F 1/3225; G06F 1/3275; G11C 5/14
See application file for complete search history.

(56) References Cited

U.S. PATENT DOCUMENTS 6,515,928 B2 * 2/2003 Sato ............... G11C 11/406
365/222
6,934,210 B2 * 8/2005 Akiba ............. G11C 11/4074
365/222

(Continued)

FOREIGN PATENT DOCUMENTS

WO    2018081746 A1    5/2018

OTHER PUBLICATIONS

ISA/KR, International Search Report and Written Opinion of the International Searching Authority, Int'l Appl. No. PCT/US2019/067415, dated Apr. 28, 2020, Korean Intellectual Property Office, Deo-gu, Daejeon, Republic of Korea, 13pgs.

*Primary Examiner* — Nimesh G Patel
(74) *Attorney, Agent, or Firm* — Holland & Hart LLP

(57) ABSTRACT

Methods, systems, and devices for memory device operation are described. A memory device may operate in different modes in response to various conditions and user constraints. Such modes may include a power-saving or low power mode. While in the low power mode, the memory device may refrain from operations, such as self-refresh operations, on one or more of the memory array(s) included in the memory device. The memory device may deactivate external interface components and components that may generate operating voltages for the memory array(s), while the memory device may continue to power circuits that store operating information for the memory device. The memory device may employ similar techniques in other operating modes to accommodate or react to different conditions or user constraints.

24 Claims, 11 Drawing Sheets

(56) References Cited

U.S. PATENT DOCUMENTS

| | | | |
|---|---|---|---|
| 7,903,487 B2* | 3/2011 | Fujioka | G11C 5/145 |
| | | | 365/203 |
| 2002/0064079 A1* | 5/2002 | Sato | G11C 11/406 |
| | | | 365/227 |
| 2004/0042334 A1* | 3/2004 | Sasaki | G11C 7/1048 |
| | | | 365/236 |
| 2007/0220281 A1* | 9/2007 | Schaver | G06F 1/3203 |
| | | | 713/300 |
| 2009/0010080 A1 | 1/2009 | Fujioka et al. | |
| 2013/0246718 A1* | 9/2013 | Ono | G06F 9/5033 |
| | | | 711/148 |
| 2015/0220135 A1* | 8/2015 | Huang | G06F 3/0647 |
| | | | 713/320 |
| 2015/0241952 A1 | 8/2015 | Asami et al. | |
| 2017/0277446 A1 | 9/2017 | Cheong | |
| 2019/0041959 A1* | 2/2019 | Pappu | G06F 13/42 |
| 2019/0392886 A1* | 12/2019 | Cox | G11C 11/4093 |
| 2020/0201418 A1* | 6/2020 | Richter | G11C 11/4076 |

* cited by examiner

MEMORY DEVICE LOW POWER MODE

CROSS REFERENCE

The present Application for Patent claims priority to U.S. Provisional Patent Application No. 62/782,661 by Richter et al., entitled "MEMORY DEVICE LOW POWER MODE," filed Dec. 20, 2018, which is assigned to the assignee hereof and is expressly incorporated by reference in its entirety.

BACKGROUND

The following relates generally to operating a memory system and more specifically to a memory device low power mode.

Memory devices are widely used to store information in various electronic devices such as computers, wireless communication devices, cameras, digital displays, and the like. Information is stored by programing different states of a memory device. For example, binary devices most often store two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory (e.g., FeRAM, PCM, RRAM) may maintain their stored logic state for extended periods of time even in the absence of an external power source. Volatile memory devices (e.g., DRAM) may lose their stored state over time unless they are periodically refreshed by an external power source.

In some cases, a memory device may have limited power resources. Solutions for decreasing the amount of power consumed by a memory device may be desired.

DETAILED DESCRIPTION

Figure 1:
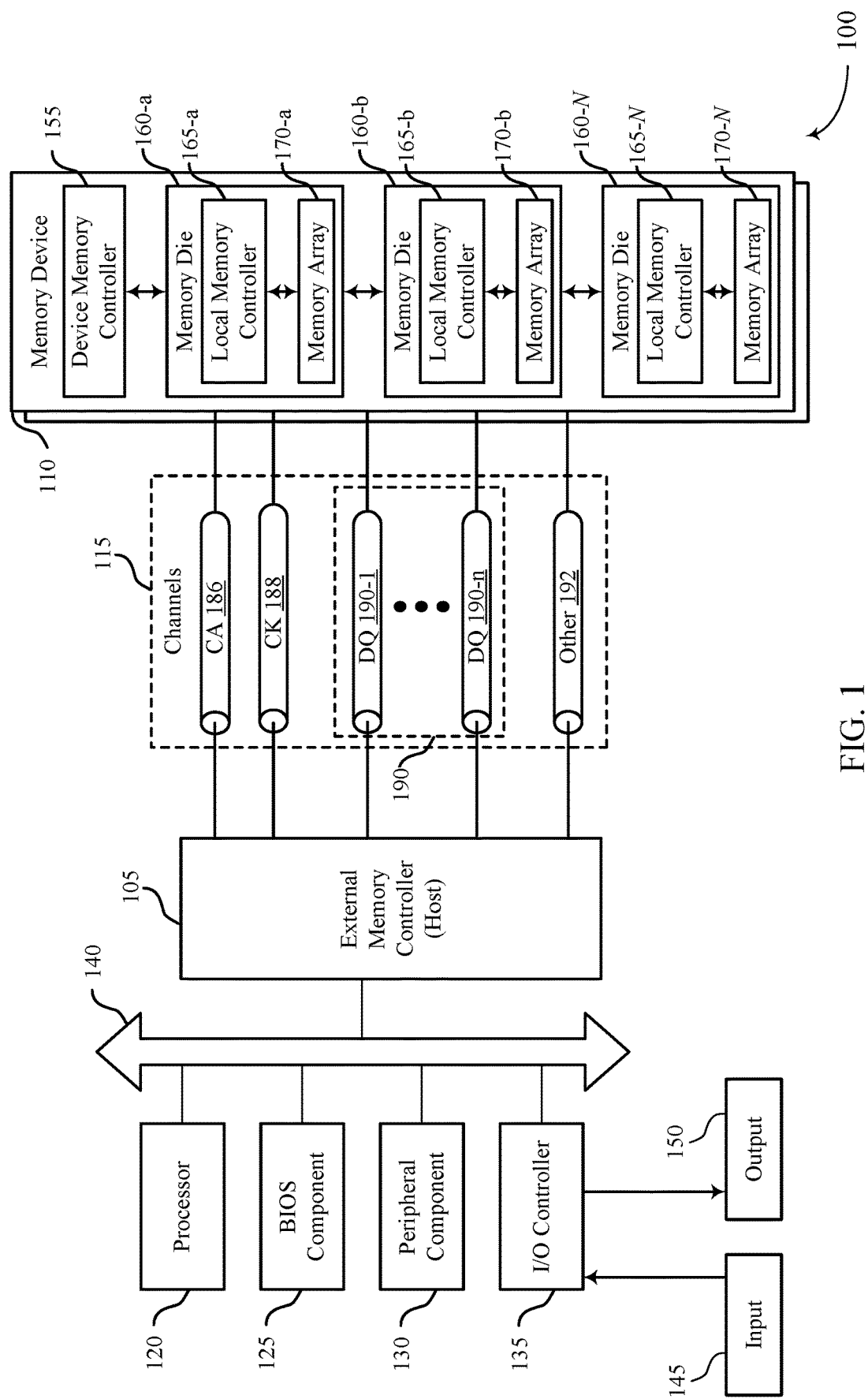
FIG. 1 illustrates aspects of an exemplary memory system that supports a memory device low power mode as disclosed herein.

In some cases, a memory device with limited power resources may unnecessarily expend these resources (e.g., by continuing to power memory arrays that store irrelevant data, or no data at all). As one way to combat this issue, a memory device may reduce its power consumption by entering a low power mode (e.g., a "sleep" mode or "idle" mode) in which it refrains from performing refresh operations, such as self-refresh operations, on its memory array(s). The memory device may also selectively power one or more components (e.g., those that store operating information) while disabling one or more other components (e.g., those that generate voltage for operating one or more of its memory array(s)). The memory controller may determine to enter the low power mode based on one or more indications from a memory controller, among other factors.

In some cases, a memory device with one or more memory arrays may not store data in the memory array(s). In such cases, the memory device may waste power by continuing to operate in a higher power, active mode (e.g., a mode in which components that facilitate operation of the memory array(s) are powered on). For example, the memory device may unnecessarily consume power by continuing to energize analog circuits (e.g., charge pumps, voltage regulators, voltage references) that generate various voltages for operating the memory array even when these components may not otherwise require that power level.

Although an empty memory device (e.g., one not storing any data) may save power by completely powering off (e.g., by disabling the memory device's power supply), doing so may have several drawbacks. First, disabling the power supply may destroy data stored in other volatile memory devices that share that power supply with the memory device. Second, powering off the memory device may increase latency of the system if the memory device performs a re-initialization process upon power-up (e.g., to re-obtain operating information lost at power-down, such as information that controls operating parameters of the memory device). For example, operating information may include fuse information such as trimming information (e.g., information regarding device-specific adjustments to internal characteristics and operating parameters of the memory device) and/or redundancy information (e.g., information indicative of defective components within the memory device), among other examples.

According to the techniques described herein, an unused memory device (e.g., a memory device with one or more empty memory array(s)) may be instructed to enter a low power mode instead of turning off or remaining in active mode. While in the low power mode, the memory device may reduce power consumption by disabling external interface(s) (e.g., command, address, clock, and data buses and associated circuitry) used to communicate with other devices (e.g., a host device). Although the memory device's power supply may remain on, the memory device may further reduce power consumption, for example, by refraining from performing self-refresh operations on its memory array(s). Given that self-refresh operations (e.g., refresh operations instigated by the memory device as opposed to an external controller) allow the memory device to retain data when power is removed from various components of the memory device, such operations are not needed when at least some if not all of the memory device's one or more empty memory arrays do not store any data.

Because the memory device does not perform certain operations, such as self-refresh operations, in the low power mode, the memory device save additional power by deactivating components that pull (e.g., draw current) from the power supply to generate voltages (as referred to herein as "operating voltages") used to operate the memory array. Thus, the low power mode may reduce power consumption compared to other modes while allowing other memory devices to draw power from the shared power supply.

Although voltage-generating components of the memory device may be deactivated in the low power mode, the memory device may continue to energize one or more circuits that store operating information for the memory device. Such preservation may allow the memory device to respond to a data request without first performing the initialization process used to obtain the operating information.

A memory device may independently enter the low power mode or may do so based on being instructed to do so by an indication received from another device, such as an external memory controller (e.g., a host device). The external memory controller may determine that the memory device is to enter the low power mode when the controller detects that the memory device is not storing any data (e.g., in its memory array(s)). Upon determining that the memory device is to enter the low power mode, the memory controller may prompt the memory device to enter the low power mode using various techniques.

In a first example, the memory controller may prompt the memory device by setting the voltage on one or more input pins to levels indicative of the low power mode. In a second example, the memory controller may assign a mode register bit to the low power mode and indicate the low power mode by setting or clearing the bit. In this example, the memory device may enter the lower power mode upon transition of the mode register bit, or wait to until a particular command is later received (e.g., the memory controller may change the meaning of the command based on the state of the mode register bit). In a third example, the memory controller may send the memory device a command with an opcode that indicates the low power mode. In a fourth example, the memory controller may repurpose unused address bits of a command to indicate the low power mode. In a fifth example, the memory controller may indicate the lower power mode via a Joint Test Action Group (JTAG) command. In this example, the memory device may enter the lower power mode upon loading of the command, or wait until a data register bit assigned to the low power mode is later loaded.

The memory controller may also determine when the memory device is to exit the lower power mode. For example, the memory controller may determine that the memory device is to exit the lower power mode when the memory controller determines that there is data to be stored at the memory device. The memory controller may prompt the memory device to exit the low power mode using various techniques. In a first example, the memory controller may prompt the exit by modifying the state of an input pin of the memory device. In a second example, the memory controller may prompt the exit by sending an instruction other than a low power entry command (e.g., by sending a command for a memory operation). In a third example, the memory device may prompt the exit by loading the complement of the JTAG data register bit used to prompt entry into the low power mode. In a fourth example, the memory device may prompt the exit by loading an instruction other than the instruction used to trigger entry into the low power mode.

Although described with reference to a low power mode, aspects of the techniques described herein may be implemented in other modes. For example, a memory device in active mode may refrain from performing refresh operations (and/or refrain from powering certain circuits for operating its memory array(s)) when the memory device determines that one or more threshold conditions has been satisfied. Example conditions include temperature-based conditions (e.g., the temperature of a die exceeds a threshold value), content-based conditions (e.g., the data stored in the memory array(s) of the device is determined to be irrelevant or corrupted), and/or processing load-based conditions (e.g., the memory device determines that it is at its processing capacity). Thus, the memory device may employ aspects of the techniques described herein in other operating modes to accommodate or react to different conditions or user constraints.

Aspects of the disclosure introduced above are further described below in the context of a memory system as described with reference to FIGS. 1-2. Specific examples are then described of a memory device and voltage-producing component that support a low power mode as described with reference to FIGS. 3-4. Aspects of the disclosure are further illustrated by and described with reference to signaling diagrams and flowcharts that relate to a low power mode as described with reference to FIGS. 5-13.

FIG. 1 illustrates aspects of an exemplary memory system 100 that supports a memory device low power mode as disclosed herein. The system 100 may include an external memory controller 105, a memory device 110, and a plurality of channels 115 that couple the external memory controller 105 with the memory device 110. A memory device 110 may also be referred to as a rank. The system 100 may include one or more memory devices 110, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be a component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. An access command may, in some cases, be a command that prompts a memory device to store or read data from one or more memory cells. The memory device 110 may include two or more memory dice 160 (e.g., memory chips) to support a desired or specified capacity for data storage.

The system 100 may further include a processor 120, a basic input/output system (BIOS) component 125, one or more peripheral components 130, and an input/output (I/O) controller 135. The components of system 100 may be coupled with or in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a GPU, a general purpose GPU (GPGPU), or a system on a chip (SoC), among other examples.

In some cases, the processor 120 may be coupled with, incorporated into, or part of the external memory controller 105. The processor 120 may select the operating mode for memory device 110. A memory device 110 may be capable of supporting different operating modes that are associated with different power consumptions. In some cases, the processor 120 may select the operating mode for memory device 110 to be the low power mode described herein. For example, the processor 120 may select the low power mode when it determines that memory device 110 is not storing data in its memory arrays 170.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components as would be understood by persons of ordinary skill in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that may provide information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include output driver circuitry and various other circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are further described with reference to FIG. 2.

The memory arrays 170 may be examples of two-dimensional (2D) arrays of memory cells or may be examples of a three-dimensional (3D) arrays of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, multiple memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs, increase the performance of the memory array, or both. In some 3D memory devices, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may perform, or facilitate, aspects of a lower power mode as described herein. For example, the device memory controller 155 may determine when memory device 110 has been prompted to enter a low power mode. The device memory controller 155 may also facilitate entry of memory device 110 into the lower power mode, as well as exit from the lower power mode.

The device memory controller 155 may be configured to communicate with the external memory controller 105, the one or more memory dice 160, or the processor 120. In some cases, the memory device 110 may receive data and/or control signals (e.g., commands and addresses) from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, encoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, commands/and/or addresses between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other components of the system 100, or its functions described herein, may be implemented by the processor 120. For example, the external memory controller 105 may be hardware, firmware, or software, or some combination thereof implemented by the processor 120 or other component of the system 100. Although the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins at external memory controller 105 and one or more pins at the memory device 110. A pin may be an example of a conductive input or output point of a device of the system 100, and a pin may be configured to act as part of a transmission line. In some cases, a pin of a terminal may be part of a signal path of the channel 115.

Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170). A signal path may be implemented using one or more types of transmission lines, including differential transmission lines and/or single-ended transmission lines.

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include multiple signal paths.

In some cases, the channels 115 may include one or more clock signal (CK) channels 188. The CK channels 188 may be configured to communicate one or more common clock signals between the external memory controller 105 and the memory device 110. Each clock signal may be configured to adjust (e.g., oscillate) between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. For example, the channels 115 may include data channels 190-1 through 190-n. Each data channel may be associated with or include one or more transmission lines. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths. In some cases, the other channels 192 may include one or more write clock signal (WCK) channels. Although the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK.

The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

Signals communicated over the channels 115 (and their associated transmission lines) may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), PAM4, and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a PAM4 symbol may represent a logic 00, a logic 01, a logic 10, or a logic 11). Examples of multi-symbol modulation schemes include, but are not limited to, PAM4, PAM8, quadrature amplitude modulation (QAM), quadrature phase shift keying (QPSK), and others. A multi-symbol signal (e.g., a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

As mentioned, system 100 may include multiple memory devices 110, which may also be referred to as memory ranks or memory modules. Some or all of these memory devices 110 may share the same power supply as well as various transmission lines (e.g., clock lines, command lines, address lines, and/or data lines). In some cases, one or more of the memory devices 110 may be empty while the others store data. In such cases, continuing to power the empty memory device 110 may waste power. However, turning off the power supply that provides power to the memory device may destroy data stored in the other memory devices that share the power supply.

According to the techniques described herein, a memory device 110 may reduce power consumption by disabling one or more components that produce voltages (e.g., device-specific voltages) for operating memory array(s) 170. For example, the memory device 110 may disable one or more components that provide the plate line voltages, word line voltage, digit line voltages, reference voltages, and bias voltages used by the memory array(s) 170. The memory device 110 may also disable one or more external interface circuits (e.g., various data buses and associated circuitry) between the memory device 110 and the external memory controller 105, as well as the circuits responsible for providing clock signals. In some cases, however, the main power supply may remain powered on to provide power to other memory devices 110. While in this mode (referred to as a low power mode, idle mode, or sleep mode), the memory device 110 may further conserve power by refraining from performing any self-refresh operations.

Although various components of the memory device 110 may be disabled during the low power mode, the memory device 110 may keep certain circuits energized to preserve operating information for the memory device 110. This operating information may enable a memory device 110 to avoid defective components and compensate for discrepancies between the physical implementation of its design and that of another memory device 110, among other aspects. For example, redundancy information may indicate defective memory cells and/or access lines as well as replacement memory cells and/or access lines to be used in lieu of the defective ones. And trimming information may indicate adjustments the memory device 110 is to make to operating parameters (e.g., timing, voltage levels, and/or current levels) based on the unique characteristics of the memory device.

A memory device 110 may obtain trimming and redundancy information, referred to together as operating information, from internal fuses via an autonomous process. The process may be initiated upon power-up or reset of a memory device 110. If a memory device 110 loses the operating information (e.g., upon power-down of the memory device 110), the memory device 110 may re-initiate the process. But the process of obtaining the operating information (e.g., reading the fuses and processing the related information) may be time-consuming. If the memory device 110 retrieves operating information each time it is awakened from low power mode to perform a data operation, the latency associated with obtaining the operating information may delay the responsiveness of the memory device 110.

According to the techniques described herein, the local circuits storing operating information for a memory device 110 may remain powered-on while the memory device is in low power mode. Because the active circuits preserve the operating information, the memory device 110 may avoid the process of obtaining the operating information from other components of system 100. Thus, the memory device 110 may be ready to perform data operations when requested by the external memory controller 105.

Although described at the rank-level, the techniques described herein can be used at any level of memory, including at the die-level and array-level. Also, aspects of the techniques described herein can be implemented in any type of operating mode, including active mode. Although described with reference to power savings, performing aspects of the techniques (e.g., such as refraining from performing refresh operations and powering down certain circuits for operating a memory array 170) may provide additional benefits such as temperature control and reduced processing. For example, a memory device 110 that is over-heating (or at risk of over-heating) may decrease its temperature by powering down the circuits used to operate one or more memory arrays 170 and refraining from performing refresh operations on those memory arrays 170. Or the same actions could be used to reduce the processing load of the memory device 110.

Figure 2:
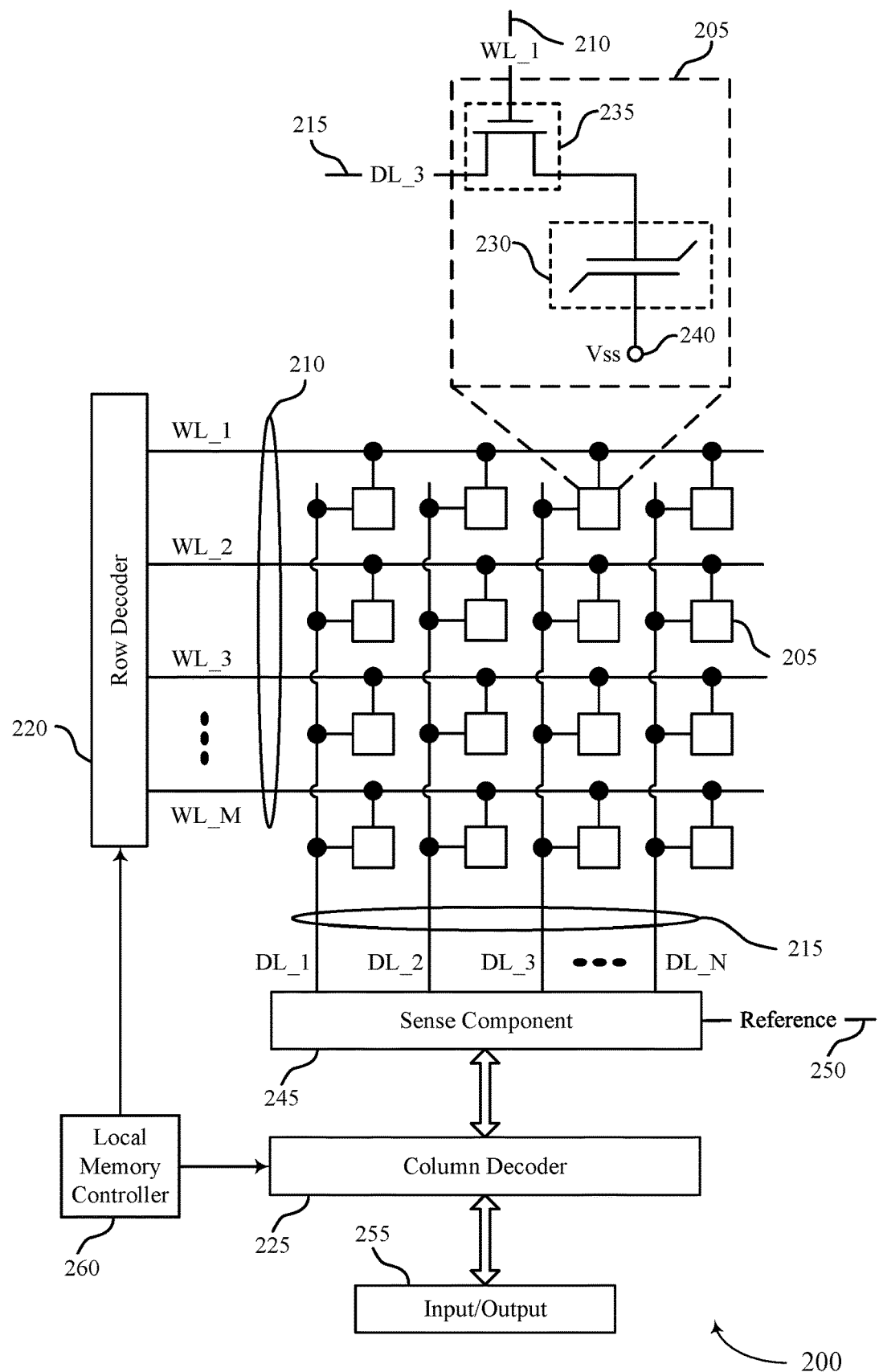
FIG. 2 illustrates an example of a memory device that supports a low power mode as disclosed herein.

FIG. 2 illustrates an example of a memory device 200 that supports a low power mode as disclosed herein. The memory device 200 may be an example of the memory device 110 or a memory die 160 described with reference to FIG. 1. In some cases, the memory device 200 may be referred to as a memory chip, memory rank, memory module, or electronic memory apparatus. The memory device 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. In DRAM architectures, a memory cell 205 may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210, digit line 215, and/or plate line. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory device 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection. The memory device 200 may include a quantity of memory banks, at least some of which, if not each of which, may have a unique address and which may include a multitude of rows and columns.

Accessing the memory cells 205 in a memory bank may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory device 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 is a ground such as Vss. In some cases, the voltage source 240 may be an example of a plate line coupled with a plate line driver. The switching component 235 may be an example of a transistor or any other type of switch device that selectively establishes or de-establishes (e.g., ceases) electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated.

In some cases, the switching component 235 may be or include a transistor and its operation may be controlled by applying a voltage to the transistor gate, where the voltage differential between the transistor gate and transistor source may be greater or less than a threshold voltage of the transistor. In some cases, the switching component 235 may be or include a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that may be used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge.

During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., a reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0.

The sense component 245 may include various transistors or amplifiers to detect and amplify a difference in the signals. In some cases, the sense component 245 may be part of another component (e.g., a column decoder 225, row decoder 220). In some cases, the sense component 245 may be in electronic communication with the row decoder 220 or the column decoder 225

The detected logic states of memory cells 205, as determined by the sense component 245 as one example, may be output through column decoder 225 as output 255. Output 255 may pass the detected logic states to one or more intermediary components (e.g., a local memory controller) for transfer over one or more channels (e.g., for transmission over one or more transmission lines). Thus, the detected logic state of memory cells 205 may be conveyed to devices or components external to memory device 200. For example, the detected logic states may be transferred (e.g., to an external memory controller 105) via one or more transmission lines.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory device 200, perform one or more operations on the memory device 200, and communicate data from the memory device 200 to the external memory controller 105 (or the device memory controller 155) in response to performing the one or more operations.

The local memory controller 260 may generate row and column address signals to activate the target word line 210 and the target digit line 215. The local memory controller 260 may also control the generation of various voltages or currents used to operate the memory device 200. For example, the local memory controller 260 may be configured to control components such as charge pumps, voltage regulators, and reference voltage circuits that produce voltages (e.g., word line voltages, plate line voltages, references voltages, bias voltages) for the memory array(s) within the memory device 200. In some cases, the local memory controller 260 may adjust the voltages output by the voltage-producing components based on trimming information. The local memory controller 260 may also, in accordance with the techniques described herein, disable one or more of the voltage-producing components when the memory device 200 enters the low power mode. In general, the amplitude, shape, or duration of an applied voltage or current discussed herein may be adjusted or varied and may be different for the various operations discussed in operating the memory device 200.

In some cases, the local memory controller 260 may be configured to perform a write operation (e.g., a programming operation) on one or more memory cells 205 of the memory device 200. The write operation may be for data received from an external device. During a write operation, a memory cell 205 of the memory device 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The voltage applied to a word line 210 may be referred to as a word line voltage and the voltage applied to a digit line may be referred to as a digit line voltage. The local memory controller 260 may apply a first signal (e.g., voltage) to the digit line 215 during the write operation to store a first state (e.g., charge) in the capacitor 230 of the memory cell 205, and the first state (e.g., charge) may be indicative of a desired logic state.

In some cases, the local memory controller 260 may be configured to perform a read operation (e.g., a sense operation) on one or more memory cells 205 of the memory device 200. The read operation may be for data requested by, or intended for, an external device. During a read operation, the logic state stored in a memory cell 205 of the memory device 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may send a signal to the sense component 245 in response to applying voltage to the access lines (e.g., in response to applying a voltage to the plate line). The sense component 245 may amplify the signal. The local memory controller 260 may activate the sense component 245 (e.g., latch the sense component) and thereby compare the signal received from the memory cell 205 to the reference signal 250. Reference signal 250 may be a reference voltage produced by a reference voltage circuit. Based on the comparison of the received signal and the reference signal 250, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation.

The memory device 200 illustrates a two-dimensional (2D) array of memory cells. In some cases, the memory device may include three-dimensional (3D) arrays or memory cells. A 3D memory array may include two or more 2D memory arrays stacked on top of one another. In some cases, 2D memory arrays in a 3D memory array may be referred to as decks, levels, layers, or dies. A 3D memory array may include any quantity of stacked 2D memory arrays (e.g., two high, three high, four high, five high, six high, seven high, eight high). This may increase the quantity of memory cells that may be positioned on a single die or substrate as compared with a single 2D memory array, which in turn may reduce production costs, increase the performance of the memory array, or both. In some 3D memory arrays, different decks may share at least one common access line such that some decks may share at least one of a word line 210 or a digit line 215.

As discussed, maintenance and operation of the memory array(s) within the memory device 200 involves the application of various voltages to various nodes, lines, and components. These voltages may be adapted to memory device 200 (e.g., according to trimming information) and produced by components (such as charge pumps, voltage regulators, and reference voltage circuits) within or coupled with memory device 200. The components that provide these voltages may rely on a power supply that powers memory device 200 and other memory devices 200.

When memory device 200 does not store any data in memory cells 205, memory device 200 may conserve power by entering a low power mode in which the memory device 200 refrains from performing self-refresh operations. Because self-refresh operations are used to preserve the logic states of memory cells, there is no need to perform such operations when the memory array of memory device 200 is empty. Given that no self-refresh operations are performed in the low power mode, memory device 200 may further increase power savings by turning off (e.g., disabling) the voltage-producing components that provide voltages for such operations. However, circuits that store operating information may remain powered on (e.g., enabled) so that memory device 200 can reference the preserved information in response to external commands (instead of first performing the time-consuming process of gathering the operating information). An additional advantage of this low power mode is that unlike the "off" mode, it allows other memory devices that share a power supply with memory device 200 to retain any data stored in their memory cells because the shared power supply remains on.

Figure 3:
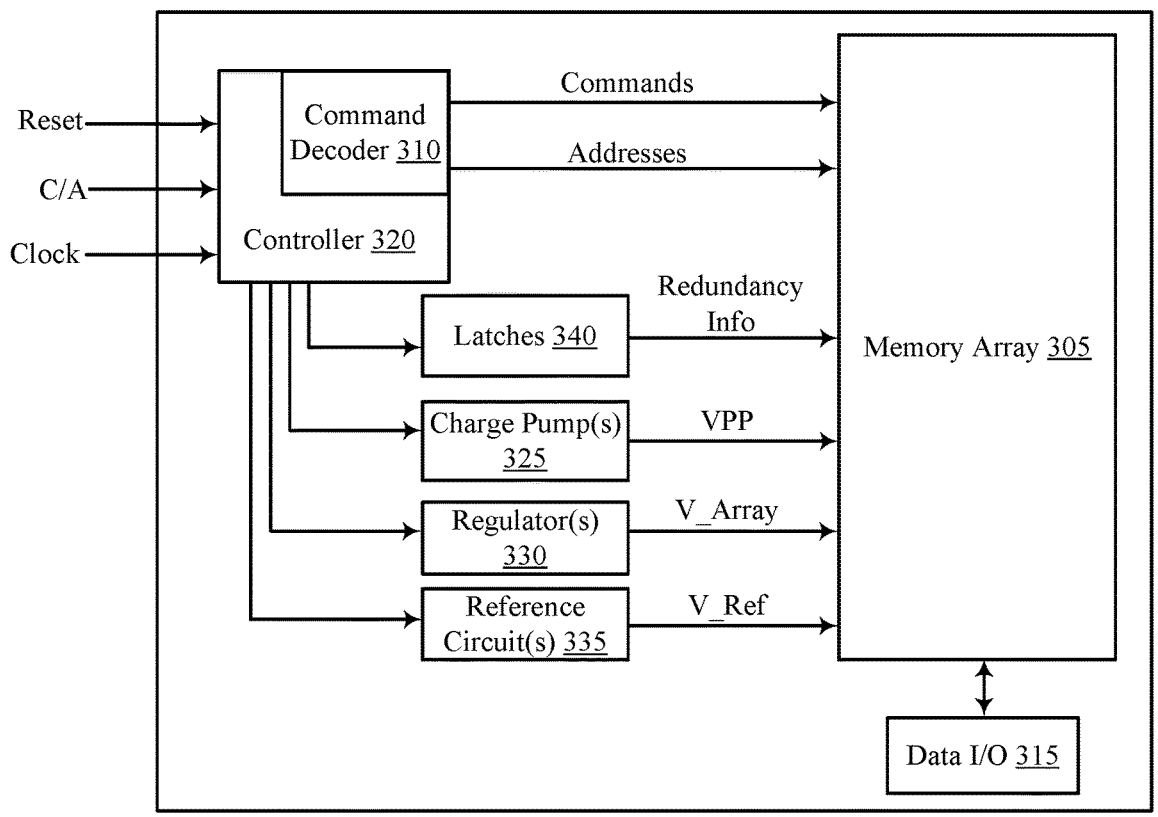
FIG. 3 illustrates an example of a memory device that supports a low power mode as disclosed herein.

FIG. 3 illustrates an example of a memory device 300 that supports a low power mode as disclosed herein. Memory device 300 may be an example of a memory device 200, a memory device 110, or a memory die 160, among other components.

Memory device 300 may include a memory array 305, which may be an example of one or more memory arrays 170 as described with reference to FIG. 1. Although shown as a single array, memory array 305 may include multiple arrays each accessible and operable by memory device 300. Memory array 305 may store or output data (e.g., data received or transmitted via data input/output (I/O) 315) in response to commands and addresses received from command decoder 310. The commands and address transmitted by command decoder 310 may be based on commands and addresses ("C/A") received from an external controller (e.g., an external memory controller 105 as described with reference to FIG. 1). Although shown collocated with controller 320, command decoder 310 may be separate from controller 320 in some examples.

Controller 320 may be an example of a local memory controller 260 described with reference to FIG. 2 or a device memory controller 155 or local memory controller 165 described with reference to FIG. 1. Controller 320 may receive control content (e.g., reset information, C/A information, and clock signals) over one or more C/A buses and use that control content to facilitate operations of memory array 305 (e.g., read operations, write operations, refresh operations, and self-refresh operations).

Controller 320 may also control the operations of components (e.g., analog circuits like charge pump(s) 325, voltage regulator(s) 330, and reference circuits 335) that generate voltages used to operate memory array 305. For example, controller 320 may adjust the outputs of the voltage-producing components according to trimming information stored in latches 340. Controller 320 may also activate and deactivate the voltage-producing components. For example, according to the techniques described herein, controller 320 may deactivate the voltage-producing components (e.g., when memory device 300 enters the low power mode) and activate the voltage-producing components (e.g., when memory device 300 exits the low power mode).

The voltage-producing components of memory device 300 may be powered by one or more power supplies shared with other memory devices 300. In this case, deactivating a voltage-producing component may include disconnecting it from its power supply (e.g., by interrupting a conductive path between the component and its power supply) and/or disabling one or more circuits within the component so that it is dormant. In some examples, a component may be referred to as "deactivated" or "disabled" if the component is in a state in which it does not draw current.

The voltage-producing components may produce voltages that are higher or lower than the power supply voltage. Thus, these components may provide biasing voltage(s) (e.g., VPP), access line voltages (e.g., V_Array, which may include plate line voltages, word line voltages, and digit line voltages), and reference voltages (e.g., V_Ref) to the memory array 305. In some cases, these operating voltages may be adjusted based on trimming information (e.g., to compensate for discrepancies between the expected and actual characteristics of memory device 300). The trimming information may be read from latches 340 which may locally store operating information obtained from fuses (e.g., non-local, non-volatile storage elements). The latches 340 may additionally or alternatively store redundancy information (also obtained from fuses) for the memory array 305.

When the memory device 300 is in the low power mode described herein, controller 320 may operate so as to preserve the operating information in the latches 340. If such information is not preserved, the memory device 300 may be unable to perform memory operations on memory array 305 until the information is re-obtained from the fuses, a process which may take time. So memory device 300 may increase responsiveness by continuing to power latches 340, as one example component, while in the low power mode. Although described as latches (e.g., D flip-flops), the circuits that store local operating information may be any type of circuit capable of storing information.

In summary, the memory device 300 may facilitate entry into, and/or exit from, a low power mode. The low power mode may be a mode in which the memory device 300 refrains from performing self-refresh operations and disables voltage-producing components but continues to supply power to circuits storing operating information. The memory device 300 may determine whether to enter the low power mode using one or more techniques described with reference to FIGS. 5 through 11.

Figure 4:
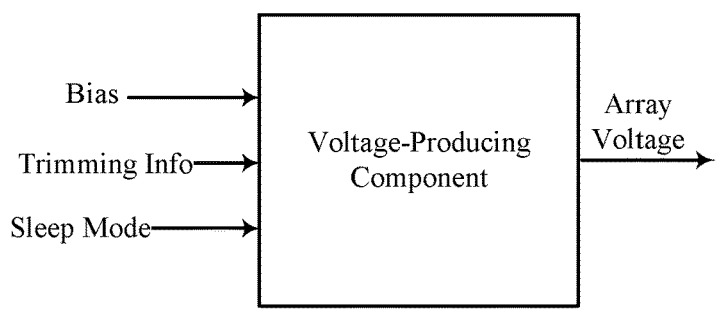
FIG. 4 illustrates an example of a voltage-producing component that supports a memory device low power mode as disclosed herein.

FIG. 4 illustrates aspects of a voltage-producing component 400 that supports a low power mode as disclosed herein. The voltage-producing component 400 may be an example of a voltage-producing component used to generate voltages to operate memory array 305 as described with reference to FIG. 3. The voltage-producing component 400 may be an analog circuit that produces a voltage higher or lower than the supply voltage used to drive the voltage-producing component. For example, the voltage-producing component 400 may be a down-regulator (e.g. a regulator 330) that produces a voltage lower than the supply voltage or a charge pump (e.g., a charge pump 325) that produces a voltage higher than the supply voltage, among other examples.

The voltage-producing component 400 may be powered by a power supply and may receive a bias voltage as a reference. The voltage-producing component 400 may select a voltage level to output based on trimming information obtained from one or more corresponding fuses (e.g., trimming information stored locally at latches 340). A controller (e.g., a controller 320 as described with reference to FIG. 3) may activate and deactivate (e.g., turn on and turn off) voltage-producing component 400 by sending a signal to an input pin of the voltage-producing component 400.

For example, the controller may raise the voltage on the input pin above a threshold voltage to activate the voltage-producing component 400 and lower the voltage on the input pin below a threshold voltage to deactivate the voltage-producing component 400. Thus, voltage-producing component 400 may be selectively powered off when the memory device including the voltage-producing component 400 is in the low power mode described herein.

Figure 5:
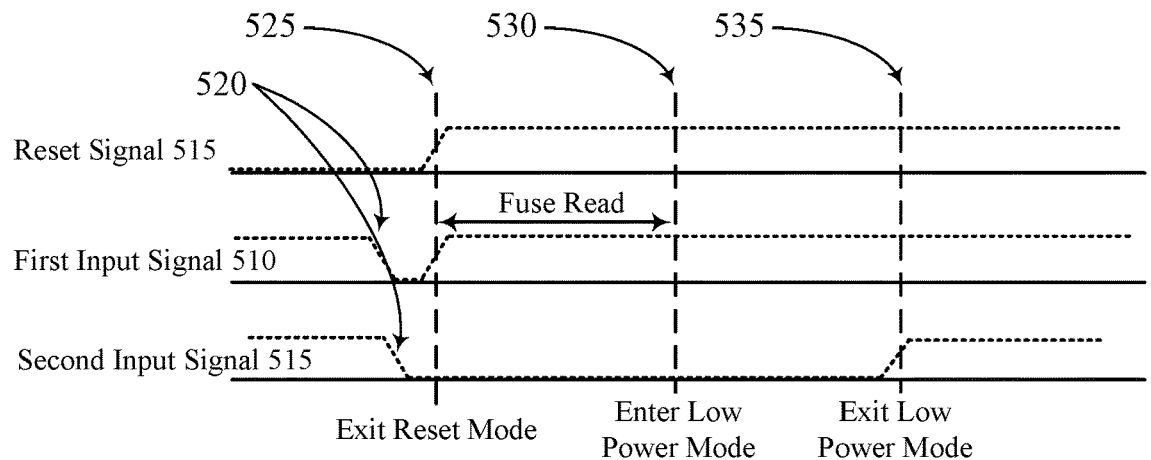
FIG. 5 illustrates an example of control signaling that supports a memory device low power mode as disclosed herein.

FIG. 5 illustrates control signaling 500 that supports a memory device low power mode as disclosed herein. Control signaling 500 may include a reset signal 505, a first input signal 510, and a second input signal 515. Reset signal 505 may represent the voltage on an input pin that is assigned to a reset mode. First input signal 510 may represent the voltage on an input pin that is assigned to entering the low power mode described herein. And second input signal 515 may represent the voltage on an input pin assigned to exiting the low power mode. The input signals may be transmitted by an external memory controller 105 as described with reference to FIG. 1, and the input pins involved in control signaling 500-a may be part of a memory device 300 described with reference to FIG. 3.

Prior to 520, the memory device may be in the reset mode. At 520, the first input signal 510 may transition from a first state (e.g., a high voltage) to a second state (e.g., a low voltage). In analog terms, a signal (or input pin) is said to transition states when its voltage goes from below a threshold to above that threshold (or a different threshold), or vice versa. In digital terms, a signal (or input pin) may transition states when it goes from a logic zero to a logic one, or vice versa.

At or around the same time as 520, the second input signal 515 may also transition from a high voltage to a low voltage.

At 525, the reset signal 505 may transition from a first state (e.g., a low voltage) to a second state (e.g., a high voltage). In response to the transition of reset signal 505, the memory device may exit reset mode. When the memory device exits reset mode, the memory device may determine that the voltage of the first input signal 510 is below a threshold voltage and the voltage of the second input signal 515 is below the same or a different threshold voltage. In some cases, the memory device makes the determination and exits reset mode at the same time or nearly the same time. In other cases, the memory device may make the determination a threshold amount of time after exiting the reset mode.

Based on this determination, the memory device may determine to enter the low power mode. However, the memory device may delay entering the low power mode until the operating information is obtained and stored (e.g., the memory device may delay until the fuses have been read and the corresponding operating information stored in latches 340). The delay may be set and/or timed by the memory device.

Upon storing the operating information in local circuits, the memory device may, at 530, enter the low power mode. The memory device may remain in the low power mode until 535, when it may detect the transition of the second input signal from a low voltage to a high voltage (e.g., relative to one or more threshold voltages). Upon detecting the transition of the second input signal, the memory device may exit the low power mode.

Figure 6:
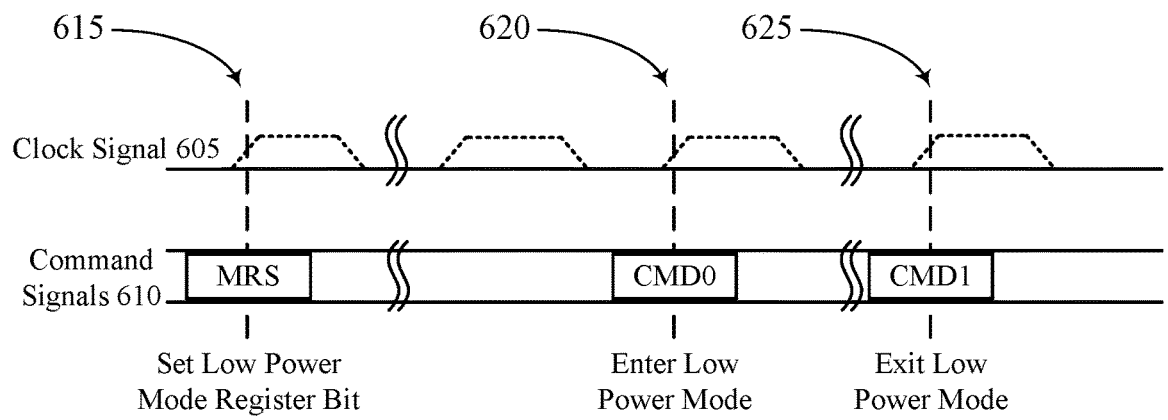
FIG. 6 illustrates control signaling that supports a memory device low power mode as disclosed herein.

FIG. 6 illustrates control signaling 600 that supports a memory device low power mode in accordance with various aspects of the present disclosure. Control signaling 600 may include a clock signal 605 and command signals 610. The clock signal 605 may be generated by a memory device 300 as described with reference to FIG. 3 and the command signals 610 may be received from an external memory controller 105 or a device memory controller 155. The command signals 610 may be received over a command bus and registered at the rising edge of the clock signal 605 (as shown) or the falling edge of the clock signal 605.

At 615, the memory device may receive a mode register set (MRS) command that instructs the memory device to set a mode register bit that is assigned to the low power mode. In response to the MRS command, the memory device may set the mode register bit assigned to the low power. This bit may also be referred to as the low power mode register bit. In some cases, the setting of this bit may prompt the memory device to immediately (e.g., within the next x clock cycle(s)) enter the low power mode. Alternatively, the setting of the bit may indicate to the memory device that the memory device is to enter the low power mode upon receipt of a particular legacy command.

A legacy command is a command that (absent the condition of a set low power mode register bit) instructs the memory device to perform an action other than enter the low power mode. A command that is dedicated to instructing the memory device to enter the low power mode may be referred to as a special command. According to the techniques described herein, the setting of the low power mode register bit may indicate that the memory device is to treat a certain legacy command as a special command to enter the low power mode.

For example, if the command received at 620 is a legacy self-refresh command (e.g., a command that normally prompts the memory device to perform a self-refresh operation), the memory device may treat the self-refresh command as a special command and enter the low power mode. Such repurposing of a legacy command may reduce command overhead (e.g., by eliminating the need to define a special command). However, using a special command may reduce signaling overhead (e.g., because the process of setting the low power mode register bit can be eliminated).

Regardless of which type of command (e.g., legacy or special) acts as a prompt to enter the low power mode, the memory device may exit the low power mode at 625. The memory device may determine to exit the low power mode upon receipt of a command (e.g., CMD1) that indicates the memory device is to exit the low power mode. Or the memory device may determine to exit the low power mode upon detection of a particular pin transitioning from one state to another (e.g., from a low voltage to a high voltage). As one example, to prevent the memory device from re-entering the low power mode, the mode register bit assigned to the low power mode may be a self-clearing bit that resets to its original state after modification.

Figure 7:
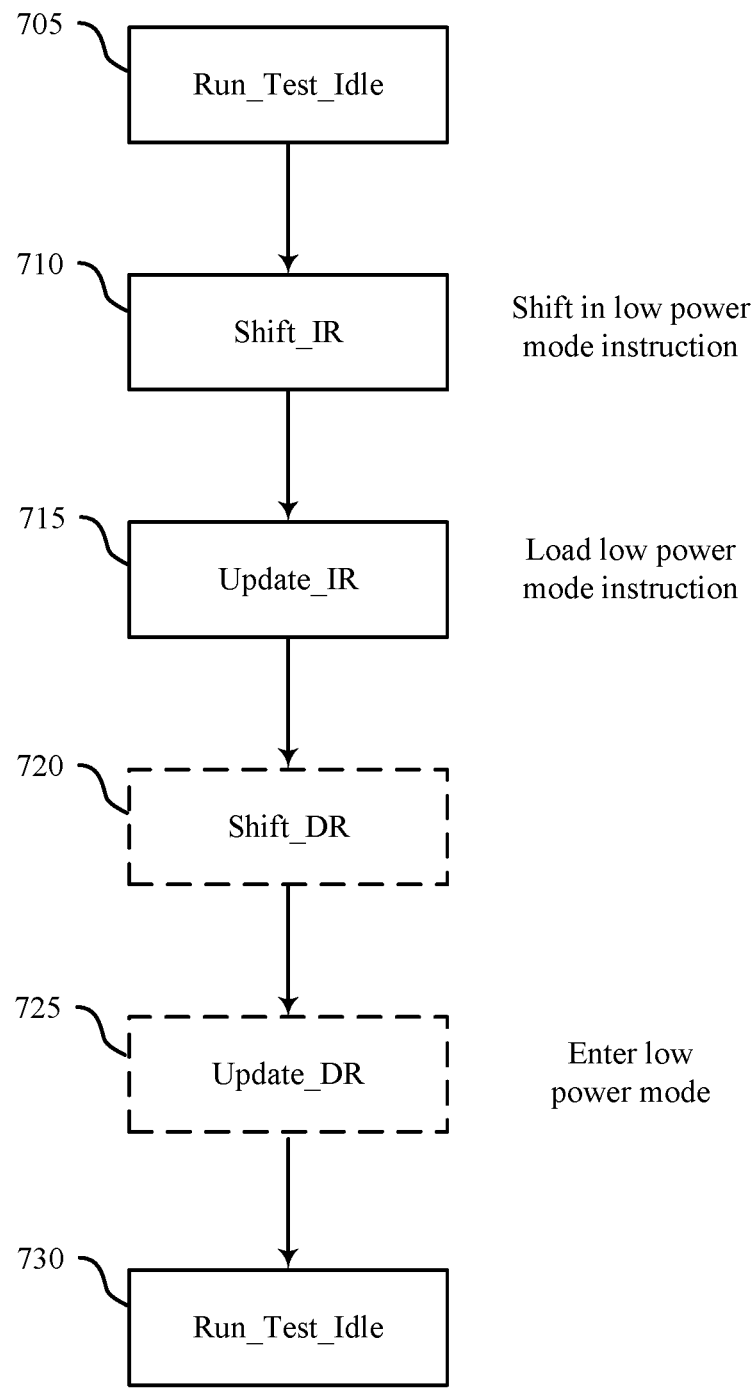
FIGS. 7 through 11 illustrate flow charts that supports entering a memory device low power mode as disclosed herein.

FIG. 7 illustrates a flow chart 700 that supports entering a memory device low power mode as disclosed herein. Aspects of flow chart 700 may be implemented by a memory device 300 as described with reference to FIG. 3. In some examples, aspects of flow chart 700 may be implemented while the memory device 300 is in self-refresh mode.

In some cases, aspects of flow chart 700 may be implemented according to Joint Test Action Group (JTAG) standards. In such cases, the implementing device may be, or communicate with, a test access port (TAP) controller. Instructions and data may be serially loaded into the TAP controller through TAP registers such as an instruction register (IR) and data register (DR). The TAP controller may be a finite state machine that uses the logic levels of certain pins (e.g., test mode select (TMS) pins) to navigate its way through various operating states (e.g., Test_Logic_Reset, Run_Test_Idle, Shift_IR, Update_IR, Shift_DR, and Update_DR). Although shown starting from a Run_Test_Idle_state, the techniques described herein can be implemented starting from a Test-Logic-Reset state.

At 705, the TAP controller may be in the Run_Test_Idle_state in which the TAP controller is in between operations. At 710, the TAP controller may enter the Shift_IR state in which instruction(s) are shifted serially into the instruction register. According to the techniques described herein, the instruction shifted into the instruction register may be an instruction to enter the low power mode. At 715, the TAP controller may enter the Update_IR state in which the instruction(s) shifted into the instruction register are loaded (e.g., are validated and made available to the TAP controller). In some cases, the TAP controller (or a controller 320) may cause a memory device (e.g., memory device 300) to enter the low power mode in response to loading the low power mode instruction. In other cases, the loading of the low power mode instruction may prepare the TAP controller (or the controller 320) to facilitate entry into the low power mode (e.g., in response to a subsequent trigger).

At 720, the TAP controller may enter the Shift_DR state in which data is shifted serially into the data register. According to the techniques described herein, an n-bit (e.g., one bit) data shift operation may shift in n data bits that correspond to the low power mode. When the TAP controller enters the Update_DR state at 725, the n data bits shifted into the data register may be loaded (e.g., may be validated and made available to the TAP controller). In response to loading the n data bits after the loading the low power mode instruction, the TAP controller (or controller 320) may cause the memory device to enter the low power mode. At 730, the TAP controller may enter, and remain in, the Run_Test_Idle state while the memory device is in the low power mode.

Once the memory device is in the low power mode, the memory device may remain in the low power mode until it receives an indication to exit the low power mode. For example, the memory device may determine to exit the low power mode when the complement of the n-data bits is loaded. Or the memory device may determine to exit the low power mode when it loads an instruction other than the instruction used to enter the low power mode. Or, in another example, the memory device may determine to exit mode upon detection that the TAP controller has entered the Test_Logic_Reset state.

One advantage of using JTAG to enter the low power mode is that doing so allows a memory device to enter the low power mode directly from self-refresh mode. Due to a memory device's limited capabilities while in self-refresh mode, the memory device may need to be awakened (e.g., put in a different mode) before it can receive legacy or special commands indicating entry into the low power mode. Because JTAG operations can be performed while a memory device is in self-refresh mode, using JTAG instructions to facilitate entry into the low power mode allows a memory device to by-pass entering a different mode before entering the low power mode.

Figure 8:
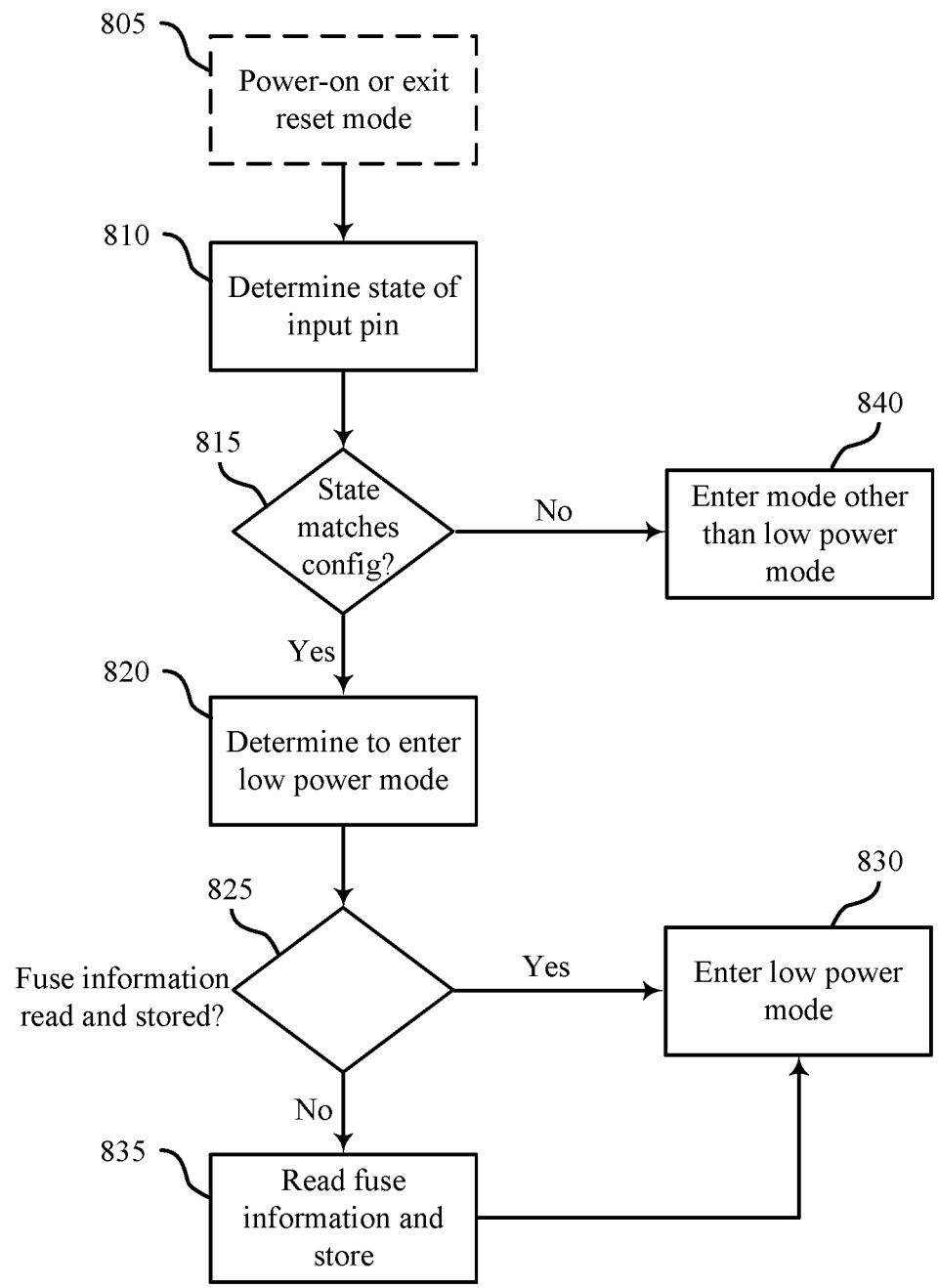

FIG. 8 illustrates a flow chart 800 that supports entering a memory device low power mode as disclosed herein. Aspects of flow chart 800 may be implemented by a memory device 300 as described with reference to FIG. 3. The memory device may include an input pin (e.g., of a command bus) assigned to the low power mode described herein. Although described with reference to a single input pin, the process described by flow chart 800 can be implemented using any quantity of input pins. In some cases, the memory device may power-on or exit a reset mode as part of the process flow (e.g., at 805).

At 810, the memory device may determine the state of the input pin assigned to the low power mode. For example, the memory device may determine whether the input pin is in a logic high state (e.g., has a voltage above a threshold voltage) or a logic low state (e.g., has a voltage below a threshold voltage). If the memory device powered-on or exited the reset mode at 805, the determination at 810 may be part of its initialization process or re-initialization process.

At 815, the memory device may determine whether the state of the input pin matches a configuration indicative of the low power mode. If the state does not match the configuration, the memory device may, at 840, enter a mode other than the low power mode. If the state matches the configuration (e.g., both are a logic high or a logic low), the memory device may, at 820, determine to enter the low power mode. In some cases, however, the memory device may refrain from (e.g., delay) entering the low power mode until after operating information has been obtained and stored locally.

For example, at 825, the memory device may determine whether information, such as fuse information (e.g., operating information such as trimming and redundancy information), has been read and stored (e.g., in latches 340). If so, the memory device may enter the low power mode at 830. If not, the memory device may read the fuse information and store it at 835 before entering the low power mode.

Figure 9:
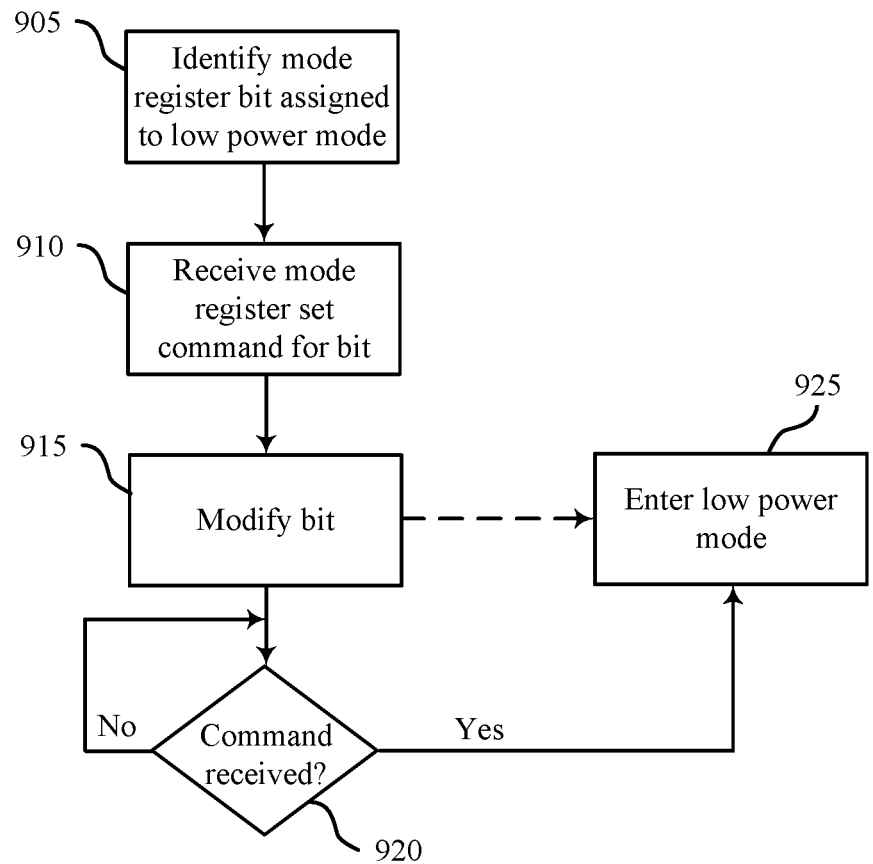

FIG. 9 illustrates a flow chart 900 that supports entering a memory device low power mode as disclosed herein. Aspects of flow chart 900 may be implemented by a memory device 300 as described with reference to FIG. 3. The memory device may include a bit, such as a mode register bit, that has been assigned to the low power mode (e.g., as described with reference to FIG. 6). Although described with reference to a single mode register bit, the process described by flow chart 900 can be implemented using any quantity of bits, such as mode register bits, among other examples.

At 905, the memory device may identify a mode register bit that is assigned to the low power mode. In some cases, the memory device may also identify a legacy command that is to be repurposed (e.g., treated as a special command in certain scenarios). At 910, the memory device may receive a mode register set (MRS) command indicating that the memory device is to set the mode register bit assigned to the low power mode. At 915, the memory device may modify the state of the bit based on the mode register set command. For example, the memory device may set the bit (e.g., store a logic one) or clear the bit (e.g., store a logic zero).

In some cases, the new state of the bit may prompt the memory device to directly enter the low power mode (e.g., at 925). Alternatively, the new state of the bit may indicate to the memory device that a particular legacy command (e.g., a refresh command or self-refresh command) is to be treated as a special command. In such cases, the memory device may not immediately enter the low power mode but instead wait for the legacy command. If the memory device determines (e.g., at 920) that the legacy command has been received, the memory device may enter the low power mode at 925 based on this determination.

In some cases, the memory device may enter the low power mode after performing the action or operation normally indicated by the legacy command. In other cases, the memory device may enter the low power mode without performing the action or operation indicated by the legacy command (e.g., the memory device may enter the low power mode instead of performing the action or operation).

Figure 10:
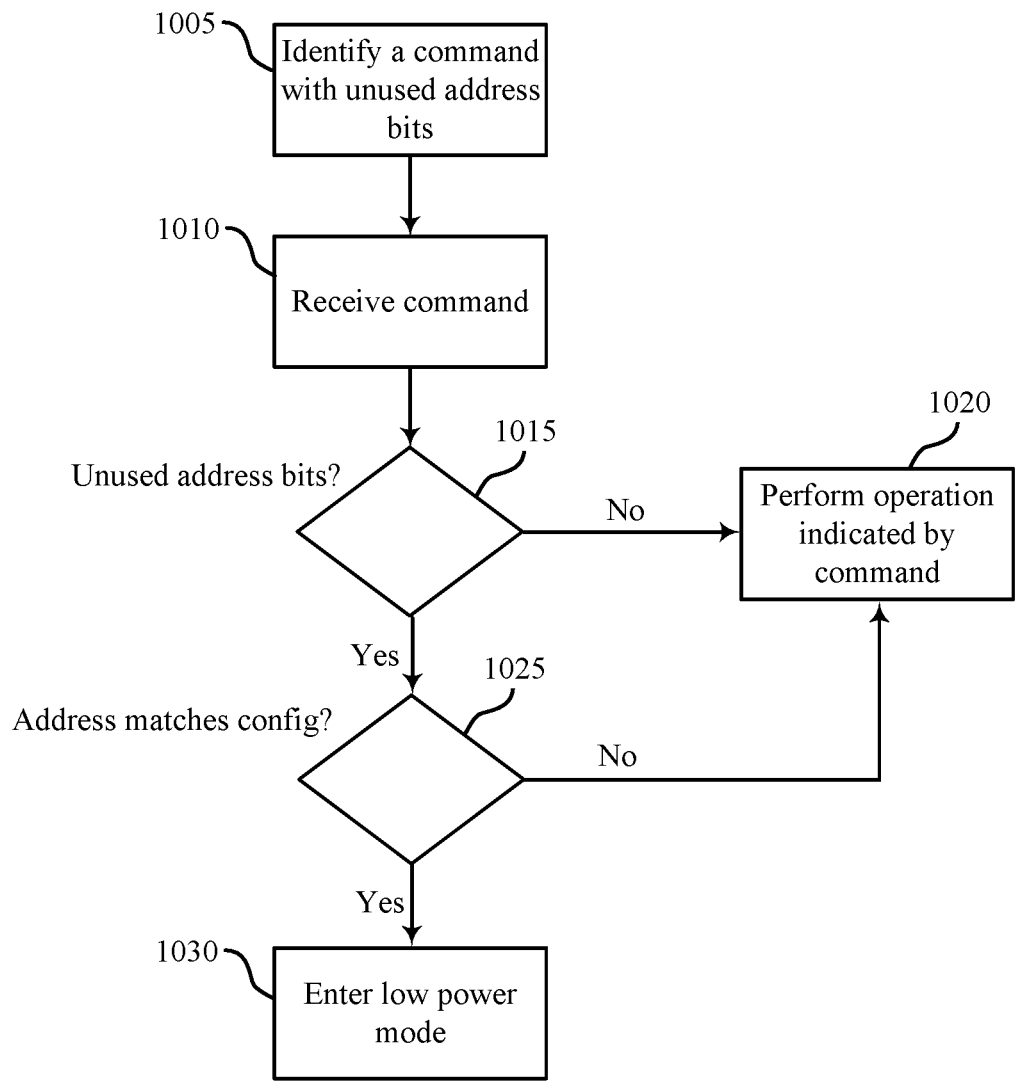

FIG. 10 illustrates a flow chart 1000 that supports entering a memory device low power mode as disclosed herein. Aspects of flow chart 1000 may be implemented by a memory device 300 as described with reference to FIG. 3.

At 1005, the memory device may identify a command with unused address bits (e.g., a command that uses a fraction of the command bus). For instance, the memory device may identify a command that has an opcode but empty address bits (e.g., because the command is for an operation unassociated with any address, such as a self-refresh command). Put another way, the memory device may identify a command whose address bits are assigned to the low power mode.

At 1010, the memory device may receive a command. At 1015, the memory device may determine whether the command is one that has been identified as having unused address bits (e.g., address bits that are neutral or set to logic 0 because they do not indicate an actual address). If the command is not one identified as having unused address bits, the memory device may, at 1020, perform the operation indicated by the command. If the command is one identified as one having unused address bits, the memory device may, at 1025, determine whether the address bits match a configuration associated with the low power mode.

If the address bits do not match the configuration, the memory device may, at 1020, perform the operation indicated by the command. If the address bits match the configuration, the memory device may, at 1030, enter the low power mode. In some cases, the memory device may enter the low power mode without performing the operation indicated by the command. In other cases, the memory device may enter the low power mode upon completing the operation indicated by the command.

Figure 11:
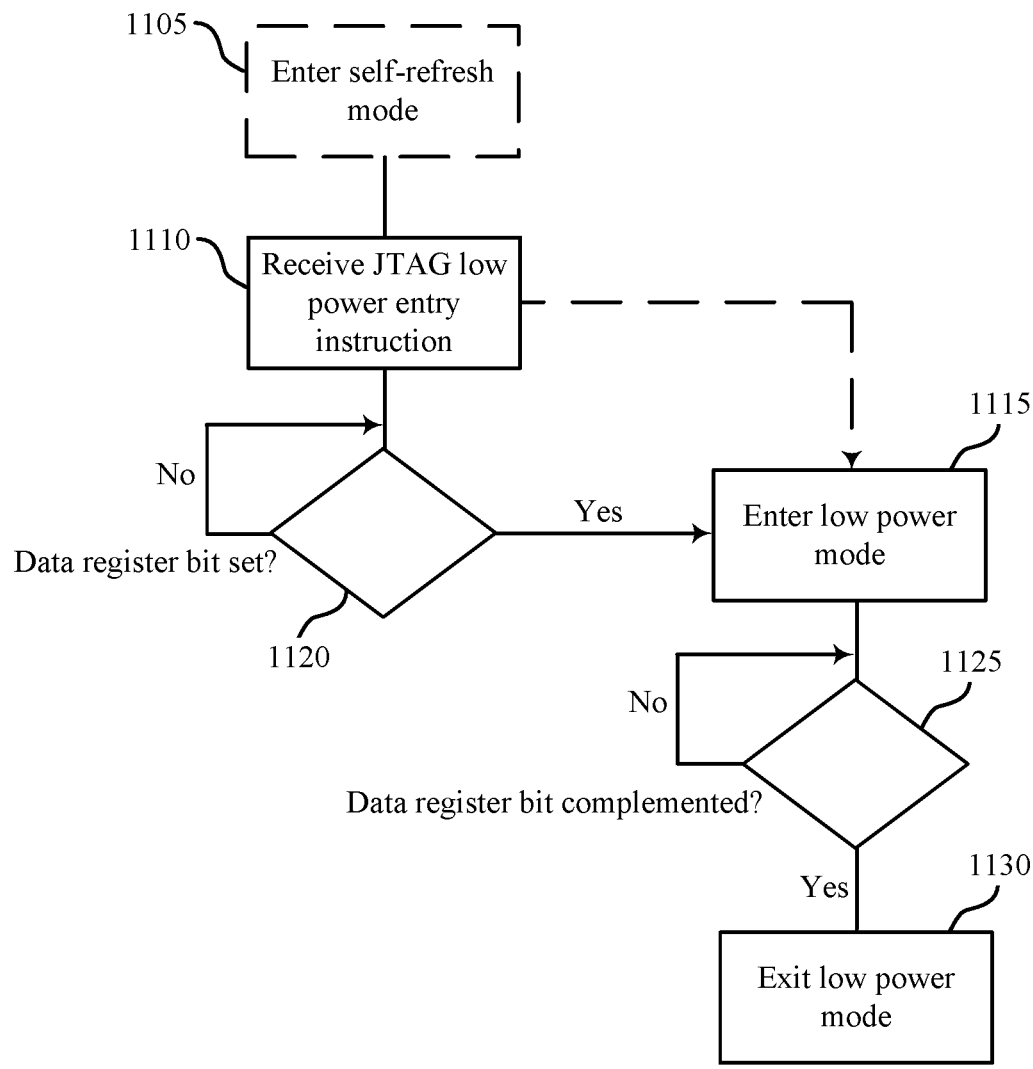

FIG. 11 illustrates a flow chart 1100 that supports entering a memory device low power mode as disclosed herein. Aspects of flow chart 1100 may be implemented by a memory device 300 as described with reference to FIG. 3.

At 1105, the memory device may enter the self-refresh mode. Although discussed in the context of a self-refresh mode, the process of flow chart 1100 can be implemented while the memory device is in any mode. At 1110, the memory device may receive a JTAG instruction indicating that the memory device is to enter the low power mode. Receiving a JTAG instruction may include shifting and loading the JTAG instruction. In some cases, the reception of the JTAG instruction may prompt the memory device to enter the low power mode. For example, the memory device may, at 1115 and in response to receiving the JTAG instruction, enter the low power mode.

Alternatively, the memory device may, at 1120, determine whether a data register bit assigned to the low power mode has been set. If the data register bit has not been set, the memory device may continue to operate normally and monitor the data register bit. If the data register bit has been set, the memory device may enter the low power mode at 1115.

Once the memory device enters the low power mode, the memory device may remain in the low power mode until it receives an indication to exit the low power mode. For example, at 1125, the memory device determines whether the data register bit that prompted entry into the low power mode has been complemented (e.g., cleared). If the data register bit has been complemented, the memory device may exit the low power mode at 1130. Alternatively, the memory device may, at 1125, determine whether an instruction has been received that is different than the instruction used to prompt entry into the low power mode. Or the memory device may, at 1125, determine whether the TAP controller has entered the Test_Logic_Reset state.

Figure 12:
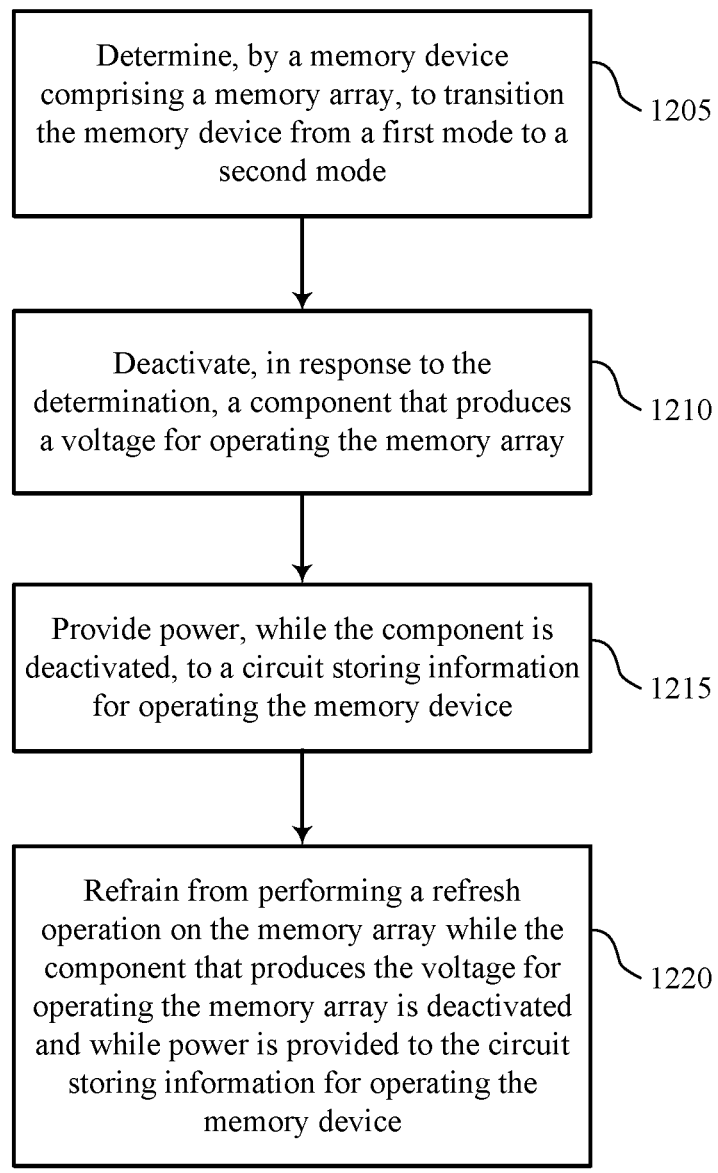
FIGS. 12 and 13 show flowcharts illustrating a method or methods as disclosed herein.

FIG. 12 shows a flowchart illustrating a method 1200 as disclosed herein. The operations of method 1200 may be implemented by a memory device or its components as described herein. For example, the operations of method 1200 may be performed by a memory controller as described with reference to FIGS. 1 through 3. In some examples, a memory controller may execute a set of instructions to control the functional elements of a memory device to perform the functions described below. Additionally or alternatively, a memory controller may perform aspects of the functions described below using special-purpose hardware.

At 1205, the method may include determining, by a memory device that includes a memory array, to transition the memory device from a first mode to a second mode. The operations of 1205 may be performed according to the methods described with reference to FIGS. 3 through 11. In some examples, aspects of the operations of 1205 may be performed by a memory controller as described with reference to FIGS. 1 through 3.

At 1210, the method may include deactivating, in response to the determination, a component that produces a voltage for operating the memory array. The operations of 1210 may be performed according to the methods described with reference to FIGS. 3 through 11. In some examples, aspects of the operations of 1210 may be performed by a memory controller as described with reference to FIGS. 1 through 3.

At 1215, the method may include providing power, while the component is deactivated, to a circuit storing information for operating the memory device. The operations of 1215 may be performed according to the methods described with reference to FIGS. 3 through 11. In some examples, aspects of the operations of 1215 may be performed by a memory controller as described with reference to FIGS. 1 through 3.

At 1220, the method may include refraining from performing a refresh operation on the memory array while the component that produces the voltage for operating the memory array is deactivated and while power is provided to the circuit storing information for operating the memory device. The operations of 1220 may be performed according to the methods described with reference to FIGS. 1 through 3. In some examples, aspects of the operations of 1220 may be performed by a memory controller as described with reference to FIGS. 1 through 3.

In some examples, an apparatus as described herein may perform a method or methods, such as the method 1200. The apparatus may include features, means, or instructions (e.g., a non-transitory computer-readable medium storing instructions executable by a processor) for determining, by a memory device comprising a memory array, to transition the memory device from a first mode to a second mode; deactivating, in response to the determination, a component that produces a voltage for operating the memory array; providing power, while the component is deactivated, to a circuit storing information for operating the memory device; and refraining from performing a refresh operation on the memory array while the component that produces the voltage for operating the memory array is deactivated and while power is provided to the circuit storing information for operating the memory device.

Some examples of the method, apparatuses, and non-transitory computer-readable medium described herein may further include operations, features, means, or instructions for receiving a command indicating that the memory device is to enter the second mode, wherein determining to transition the memory device from the first mode to the second mode is based at least in part on receiving the command.

Some examples of the method, apparatuses, and non-transitory computer-readable medium described herein may further include operations, features, means, or instructions for determining a state of an input pin associated with the second mode, wherein determining to transition the memory device from the first mode to the second mode is based at least in part on determining the state of the input pin.

Some examples of the method, apparatuses, and non-transitory computer-readable medium described herein may further include operations, features, means, or instructions for reading the information for operating the memory device from a fuse and entering the second mode after reading the information from the fuse. In such cases, entering the second mode may comprise deactivating the component that produces the voltage for operating the memory array.

Some examples of the method, apparatuses, and non-transitory computer-readable medium described herein may further include operations, features, means, or instructions for determining that a mode register bit associated with the second mode has changed states. In such examples, determining to transition from the first mode to the second mode may be based at least in part on determining that the mode register bit has changed states. In one example, the memory device may enter the second mode in response to determining that the mode register bit associated with the second mode has changed state. In another example, the memory device may 1) receive a command to perform a refresh operation on the memory array and 2) enter, without performing the refresh operation, the second mode in response to receiving the command.

Some examples of the method, apparatuses, and non-transitory computer-readable medium described herein may further include operations, features, means, or instructions for determining that one or more address bits associated with a received command are assigned to the second mode and determining that the one or more address bits match a configuration. In such cases, determining to transition from the first mode to the second mode may be based at least in part on determining that the one or more address bits match the configuration.

Some examples of the method, apparatuses, and non-transitory computer-readable medium described herein may further include operations, features, means, or instructions for receiving, while in the first mode, a JTAG instruction indicating that the memory device is to enter the second mode. In such cases, determining to transition from the first mode to the second mode is based at least in part on receiving the JTAG instruction. In one example, the memory device may enter the second mode in response to receiving the JTAG instruction. In another example, the memory device may 1) receive a bit after receiving the JTAG instruction and 2) enter the second mode based at least in part on receiving the bit after receiving the JTAG instruction.

Some examples of the method, apparatuses, and non-transitory computer-readable medium described herein may further include operations, features, means, or instructions for detecting a transition of an input pin from a first voltage to a second voltage and determining to exit the second mode based at least in part on detecting the transition of the input pin from the first voltage to the second voltage.

In some examples, a device as described herein may perform a method or methods, such as the method 1200. The device may include a memory array and a circuit configured to store information for operating the device. The device may also include a memory control coupled with the memory array and operable to cause the device to: determine to transition the device from a first mode to a second mode, deactivate, in response to the determination, a component that produces a voltage for operating the memory array, provide power, while the component is deactivated, to the circuit configured to store information for operating the device, and refrain from performing a refresh operation on the memory array while the component that produces the voltage for operating the memory array is deactivated and while power is provided to the circuit configured to store the information for operating the device.

In some examples, the memory controller may be operable to cause the device to receive a command indicating that the device is to enter the second mode, wherein determining to transition the device from the first mode to the second mode is based at least in part on receiving the command. In some examples, the memory controller may be operable to cause the device to determine a state of an input pin associated with the second mode, wherein determining to transition the device from the first mode to the second mode is based at least in part on determining the state of the input pin.

Figure 13:
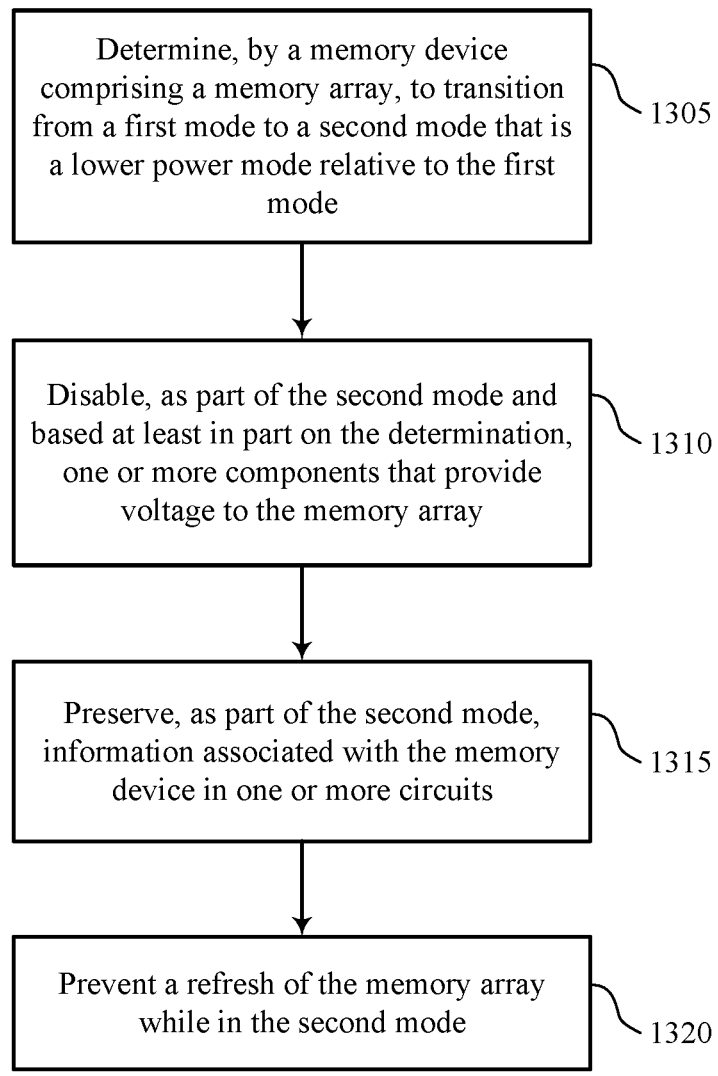

FIG. 13 shows a flowchart illustrating a method 1300 as disclosed herein. The operations of method 1300 may be implemented by a memory device or its components as described herein. For example, the operations of method 1300 may be performed by a memory device as described with reference to FIGS. 1 through 11. In some examples, a memory controller may execute a set of instructions to control the functional elements of the memory device to perform the functions described below. Additionally or alternatively, a memory controller may perform aspects of the functions described below using special-purpose hardware.

At 1305, the method may include determining, by a memory device that includes a memory array, to transition from a first mode to a second mode that is a lower power mode relative to the first mode. The operations of 1305 may be performed according to the methods described with reference to FIGS. 3 through 11. In some examples, aspects of the operations of 1305 may be performed by a memory device as described with reference to FIGS. 1 through 3.

At 1310, the method may include disabling, as part of the second mode and based at least in part on the determination, one or more components that provide voltage to the memory array. The operations of 1310 may be performed according to the methods described with reference to FIGS. 3 through 11. In some examples, aspects of the operations of 1310 may be performed by a memory device as described with reference to FIGS. 1 through 3.

At 1315, the method may include preserving, as part of the second mode, information associated with the memory device in one or more circuits. The operations of 1315 may be performed according to the methods described with reference to FIGS. 3 through 11. In some examples, aspects of the operations of 1315 may be performed by a memory device as described with reference to FIGS. 1 through 3.

At 1320, the method may include preventing a refresh of the memory array while in the second mode. The operations of 1320 may be performed according to the methods described with reference to FIGS. 3 through 11. In some examples, aspects of the operations of 1320 may be performed by a memory device as described with reference to FIGS. 1 through 3.

In some examples, an apparatus as described herein may perform a method or methods, such as the method 1300. The apparatus may include features, means, or instructions (e.g., a non-transitory computer-readable medium storing instructions executable by a processor) for determining, by a memory device comprising a memory array, to transition from a first mode to a second mode that is a lower power mode relative to the first mode; disabling, as part of the second mode and based at least in part on the determination, one or more components that provide voltage to the memory array; preserving, as part of the second mode, information associated with the memory device in one or more circuits; and preventing a refresh of the memory array while in the second mode.

Some examples of the method, apparatuses, and non-transitory computer-readable medium described herein may further include operations, features, means, or instructions for determining that a voltage of a pin associated with the second mode satisfies a threshold value and entering the second mode, after reading the information from a fuse, based at least in part determining that the voltage of the pin satisfies the threshold value.

Some examples of the method, apparatuses, and non-transitory computer-readable medium described herein may further include operations, features, means, or instructions for receiving a first command to modify a state of a mode register bit assigned to the second mode. In one example, the method, apparatuses, and non-transitory computer-readable medium described herein may further include operations, features, means, or instructions for modifying the state of the mode register bit based at least in part on the first command, where determining to transition from the first mode to the second mode is in response to the modification.

In another example, the method, apparatuses, and non-transitory computer-readable medium described herein may further include operations, features, means, or instructions for receiving, after modifying the state of the mode register bit, a second command to perform an operation on the memory array, where determining to transition from the first mode to the second mode is based at least in part on receiving the second command after modifying the state of the mode register bit.

Some examples of the method, apparatuses, and non-transitory computer-readable medium described herein may further include operations, features, means, or instructions for receiving a command comprising an opcode and address bits, identifying the opcode as one corresponding to an operation unassociated with an address, and determining, based at least in part on the identification, that the address bits indicate the second mode.

In some examples, a device as described herein may perform a method or methods, such as the method 1300. The device may include a memory array and a circuit configured to store information associated with the device. The device may also include a memory controller coupled with the memory array and operable to cause the device to: determine to transition from a first mode to a second mode, the second mode being a lower power mode relative to the first mode, disable, as part of the second mode and based at least in part on the determination, one or more components that provide voltage to the memory array, preserve, as part of the second mode, information associated with the device in the circuit, and prevent a refresh of the memory array while in the second mode.

In some examples, the memory controller may be operable to cause the device to 1) receive a first command to modify a state of a mode register bit assigned to the second mode and 2) modify the state of the mode register bit based at least in part on the first command, wherein determining to transition from the first mode to the second mode is in response to the modification.

In some examples, the memory controller may be operable to cause the device to receive a command comprising an opcode and address bits, identify the opcode as one corresponding to an operation unassociated with an address, and determine, based at least in part on the identification, that the address bits indicate the second mode.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including system 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
    determining, by a memory device comprising a memory array, to transition the memory device from a first mode to a second mode;
    deactivating, in response to the determination, a component that produces a voltage for operating the memory array;
    reading, from one or more fuse circuits, operating information for operating the memory device based at least in part on determining to transition to the second mode;
    providing power, as part of the second mode and while the component that produces a voltage for operating the memory array is deactivated, to a circuit storing the operating information read from one or more fuse circuits for operating the memory device based at least in part on determining to transition to the second mode; and
    refraining from performing a refresh operation on the memory array while the component that produces the voltage for operating the memory array is deactivated and while power is provided to the circuit storing operating information for operating the memory device.

2. The method of claim 1, further comprising:
    receiving a command indicating that the memory device is to enter the second mode, wherein determining to transition the memory device from the first mode to the second mode is based at least in part on receiving the command.

3. The method of claim 1, further comprising:
    determining a state of an input pin associated with the second mode, wherein determining to transition the memory device from the first mode to the second mode is based at least in part on determining the state of the input pin.

4. The method of claim 1, further comprising:
    reading the operating information for operating the memory device from a fuse; and
    entering the second mode after reading the operating information from the fuse, wherein entering the second mode comprises deactivating the component that produces the voltage for operating the memory array.

5. The method of claim 1, further comprising:
    determining that a mode register bit associated with the second mode has changed states, wherein determining to transition from the first mode to the second mode is based at least in part on determining that the mode register bit has changed states.

6. The method of claim 5, further comprising:
    entering the second mode in response to determining that the mode register bit associated with the second mode has changed states.

7. The method of claim 5, further comprising:
    receiving a command to perform a refresh operation on the memory array; and
    entering, without performing the refresh operation, the second mode in response to receiving the command.

8. The method of claim 1, further comprising:
determining that one or more address bits associated with a received command are assigned to the second mode; and
determining that the one or more address bits match a configuration, wherein determining to transition from the first mode to the second mode is based at least in part on determining that the one or more address bits match the configuration.

9. The method of claim 1, further comprising:
receiving, while in the first mode, a joint test action group (JTAG) instruction indicating that the memory device is to enter the second mode, wherein determining to transition from the first mode to the second mode is based at least in part on receiving the JTAG instruction.

10. The method of claim 9, the method further comprising:
entering the second mode in response to receiving the JTAG instruction.

11. The method of claim 9, further comprising:
receiving a data bit after receiving the JTAG instruction; and
entering the second mode based at least in part on receiving the data bit after receiving the JTAG instruction.

12. The method of claim 1, further comprising:
detecting a transition of an input pin from a first voltage to a second voltage; and
determining to exit the second mode is based at least in part on detecting the transition of the input pin from the first voltage to the second voltage.

13. A method, comprising:
determining, by a memory device comprising a memory array, to transition from a first mode to a second mode that is a lower power mode relative to the first mode;
disabling, as part of the second mode and based at least in part on the determination, one or more components that provide voltage to the memory array;
reading, from one or more fuse circuits, operating information for operating the memory device based at least in part on determining to transition to the second mode;
storing the operating information for the memory device in a circuit based at least in part on reading the operating information; and
preventing a refresh of the memory array after storing the operating information in the circuit and while in the second mode.

14. The method of claim 13, further comprising:
determining that a voltage of a pin associated with the second mode satisfies a threshold value; and
entering the second mode, after reading the operating information from a fuse, based at least in part on determining that the voltage of the pin satisfies the threshold value.

15. The method of claim 13, further comprising:
receiving a first command to modify a state of a mode register bit assigned to the second mode.

16. The method of claim 15, further comprising:
modifying the state of the mode register bit based at least in part on the first command, wherein determining to transition from the first mode to the second mode is in response to the modification.

17. The method of claim 15, further comprising:
receiving, after modifying the state of the mode register bit, a second command to perform an operation on the memory array, wherein determining to transition from the first mode to the second mode is based at least in part on receiving the second command after modifying the state of the mode register bit.

18. The method of claim 13, further comprising:
receiving a command comprising an opcode and address bits;
identifying the opcode as one corresponding to an operation unassociated with an address; and
determining, based at least in part on the identification, that the address bits indicate the second mode.

19. A device, comprising:
a memory array;
a circuit configured to store operating information for operating the device; and
a memory controller coupled with the memory array and operable to cause the device to:
determine to transition the device from a first mode to a second mode;
deactivate, in response to the determination, a component that produces a voltage for operating the memory array;
read, from one or more fuse circuits, the operating information for operating the device based at least in part on determining to transition to the second mode;
provide power, as part of the second mode and while the component that produces a voltage for operating the memory array is deactivated, to the circuit storing the operating information read from one or more fuse circuits for operating the device based at least in part on determining to transition to the second mode; and
refrain from performing a refresh operation on the memory array while the component that produces the voltage for operating the memory array is deactivated and while power is provided to the circuit configured to store the operating information for operating the device.

20. The device of claim 19, wherein the memory controller is operable to cause the device to:
receive a command indicating that the device is to enter the second mode, wherein determining to transition the device from the first mode to the second mode is based at least in part on receiving the command.

21. The device of claim 19, wherein the memory controller is operable to cause the device to:
determine a state of an input pin associated with the second mode, wherein determining to transition the device from the first mode to the second mode is based at least in part on determining the state of the input pin.

22. A device, comprising:
a memory array;
a circuit configured to store information associated with the device; and
a memory controller coupled with the memory array and operable to cause the device to:
determine to transition from a first mode to a second mode, the second mode being a lower power mode relative to the first mode;
disable, as part of the second mode and based at least in part on the determination, one or more components that provide voltage to the memory array;
read, from one or more fuse circuits, operating information for operating the device based at least in part on determining to transition to the second mode;
store the operating information for the device in the circuit based at least in part on reading the operating information; and
prevent a refresh of the memory array after storing the operating information in the circuit and while in the second mode.

23. The device of claim 22, wherein the memory controller is operable to cause the device to:
   receive a first command to modify a state of a mode register bit assigned to the second mode; and
   modify the state of the mode register bit based at least in part on the first command, wherein determining to transition from the first mode to the second mode is in response to the modification.

24. The device of claim 22, wherein the memory controller is operable to cause the device to:
   receive a command comprising an opcode and address bits;
   identify the opcode as one corresponding to an operation unassociated with an address; and
   determine, based at least in part on the identification, that the address bits indicate the second mode.

* * * * *